(12) United States Patent
Kim

(10) Patent No.: US 9,595,659 B2
(45) Date of Patent: Mar. 14, 2017

(54) PIEZOELECTRIC VIBRATION DEVICE FOR MOBILE TERMINAL

(71) Applicant: Jung-Hoon Kim, Daegu (KR)

(72) Inventor: Jung-Hoon Kim, Daegu (KR)

( * ) Notice: Subject to any disclaimer, the term of this patent is extended or adjusted under 35 U.S.C. 154(b) by 540 days.

(21) Appl. No.: 14/266,244

(22) Filed: Apr. 30, 2014

(65) Prior Publication Data

US 2015/0318462 A1    Nov. 5, 2015

(51) Int. Cl.
*H01L 41/08*    (2006.01)
*H01L 41/193*   (2006.01)
*G06F 3/01*     (2006.01)
*G08B 6/00*     (2006.01)
*H01L 41/09*    (2006.01)
*H01L 41/18*    (2006.01)
*H04M 19/04*    (2006.01)

(52) U.S. Cl.
CPC ............ *H01L 41/193* (2013.01); *G06F 3/016* (2013.01); *G08B 6/00* (2013.01); *H01L 41/0933* (2013.01); *H01L 41/183* (2013.01); *H04M 19/047* (2013.01)

(58) Field of Classification Search
CPC .. H01L 41/0933; H01L 41/1853; G08B 3/016
USPC .......... 310/330, 332, 348, 311, 329
See application file for complete search history.

(56) References Cited

U.S. PATENT DOCUMENTS

| | | | | |
|---|---|---|---|---|
| 8,669,690 B2* | 3/2014 | Ishii | ............. | B06B 1/0603 310/328 |
| 8,829,765 B2* | 9/2014 | Tang | ............. | H01L 41/083 310/330 |
| 9,504,138 B2* | 11/2016 | Gandhi | ............. | H01L 23/52 |
| 2015/0181338 A1* | 6/2015 | Hosoi | ............. | H04R 5/033 381/309 |

* cited by examiner

*Primary Examiner* — Thomas Dougherty
*Assistant Examiner* — Karen B Addison
(74) *Attorney, Agent, or Firm* — Novick, Kim & Lee, PLLC; Jae Youn Kim

(57) ABSTRACT

A piezoelectric vibration device for a mobile terminal is disclosed. A bimorph piezoelectric vibrator includes a pair of piezoelectric element layers connected to one of positive and negative poles and a middle electrode plate interposed between the piezoelectric element layers and connected to the other pole. The piezoelectric vibrator generates vibration due to up/down bending displacement by fixing both end portions thereof to an inner surface of a casing of a mobile terminal. A voltage-boosting transformer raises a power source voltage of a mobile terminal to a driving voltage. A driving chip receives the raised driving voltage from the voltage-boosting transformer and drives the piezoelectric vibrator. Weights are attached to at least one of both sides of the piezoelectric vibrator to amplify vibration. Insulation members are provided at both end portions of the piezoelectric vibrator to prevent electricity applied to the piezoelectric vibrator from leaking to the casing.

12 Claims, 9 Drawing Sheets

BOTH ENDS FIXED (A) CONTRACTION (B) EXPANSION

PIEZOELECTRIC VIBRATION DEVICE FOR MOBILE TERMINAL

BACKGROUND OF THE INVENTION

Field of the Invention

The present invention relates to a vibration device, and more particularly, to a vibration device for a mobile terminal, which generates vibration using piezoelectric effect.

Description of the Related Art

Recently, as virtual reality technology is developed, users increasingly desire more detailed and realistic information through virtual reality. One of the technologies developed to satisfy users' desires is haptic technology which transmits tactile sense and force. Such haptic technology is not only used for notification function using a vibration motor in a mobile phone, but also is widely used in various fields such as medical simulators, game devices or the like.

Specifically, a haptic device as well as a monitor and a speaker will be installed to a computing apparatus as an essential output device. This is because installing a haptic device to a portable electronic apparatus provides advantages of high perception of tactile stimuli and superior interoperability with IT apparatuses.

A vibration motor of a mobile terminal, which is a concrete example of a haptic technology applied to a portable electronic apparatus such as a smartphone, may enable a user to vividly feel vibration by adding vibration to a sound and an image output from a mobile terminal.

In general, a conventional vibration motor employed to a mobile terminal is a vibration generator using weight eccentricity, which simply vibrates the whole mobile terminal. A vibration device using an eccentric rotating mass (ERM), which is configured to vibrate by rotational eccentricity of a motor, has a response speed of about 200 ms. However, this response speed is quite insufficient to satisfy a user's demand for operational simultaneity.

Another example of a vibration motor employed to a mobile terminal is disclosed in Korean Patent Registration No.10-0793682, "MICRO LINEAR VIBRATION DEVICE" (cited reference 1). A linear vibration motor described in the cited reference 1 is configured to vibrate by vertical linear movement using a coil and a magnet, and has a response speed of about 50 ms. This response speed is greater than that of the ERM, however, it is still insufficient to satisfy a user's demand for operational simultaneity and cannot transmit slight vibration to a specific body part such as a fingertip.

In order to realize a haptic function optimized to a portable electronic apparatus, various vibration patterns including strong vibration, slight vibration and the like should be controlled to have an extremely high response speed. However, a vibration device configured with an ERM using rotational eccentricity or a linear motor using vertical linear movement just provides simple vibration.

Therefore, it is required to develop a vibration device for a mobile terminal, which can be precisely controlled to have a high response speed capable of satisfying diverse and complicated functions and can transmit slight vibration to a local body part such as a fingertip.

SUMMARY OF THE INVENTION

Therefore, it is an object of the present invention to provide a piezoelectric vibration device for a mobile terminal, which has a high response speed and a thickness for minimizing an internal space of a mobile terminal, and vibration magnitude and speed of which can be precisely and independently controlled.

It is another object of the present invention to provide a piezoelectric vibration device for a mobile terminal, the amount of vibration of which can be over two times more than that of a conventional vibration motor, and which can achieve multi position vibration.

In accordance with the present invention, the above and other objects can be accomplished by the provision of a piezoelectric vibration device for a mobile terminal, comprising: a bimorph piezoelectric vibrator including a pair of piezoelectric element layers connected to one of positive and negative poles and a middle electrode plate interposed between the piezoelectric element layers and connected to the other pole, the piezoelectric vibrator being configured to generate vibration due to up/down bending displacement by fixing both end portions of the piezoelectric vibrator to an inner surface of a casing of a mobile terminal; a voltage-boosting transformer to raise a power source voltage of a mobile terminal to a driving voltage of about 20 to about 300V; a driving chip to receive the raised driving voltage from the voltage-boosting transformer and drive the piezoelectric vibrator by the raised driving voltage; weights attached to at least one of both sides of the piezoelectric vibrator in order to amplify vibration of the piezoelectric vibrator; and insulation members to insulate both end portions of the piezoelectric vibrator from the inner surface of the casing, thereby preventing electricity applied to the piezoelectric vibrator from leaking to the casing.

As is apparent from the above description, since the vibration device using the bimorph piezoelectric element is mounted in a limited space of a mobile terminal and generates vibration using a reverse piezoelectric effect, a response speed is increased so as to generate a simultaneous vibration effect corresponding to sound and image of a mobile terminal, and vibration magnitude and speed can be precisely controlled.

Further, since the piezoelectric vibrator of the present invention has a smaller thickness than a conventional vibration motor, the space occupied by the vibrator is reduced, which is helpful to manufacture slim mobile terminals. In addition, since a plurality of vibrators can be mounted in a mobile terminal, various vibration modes can be realized at the same time, the amount of vibration is increased so as to enable a user to easily discriminate vibration signals, and multi position vibration can be achieved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
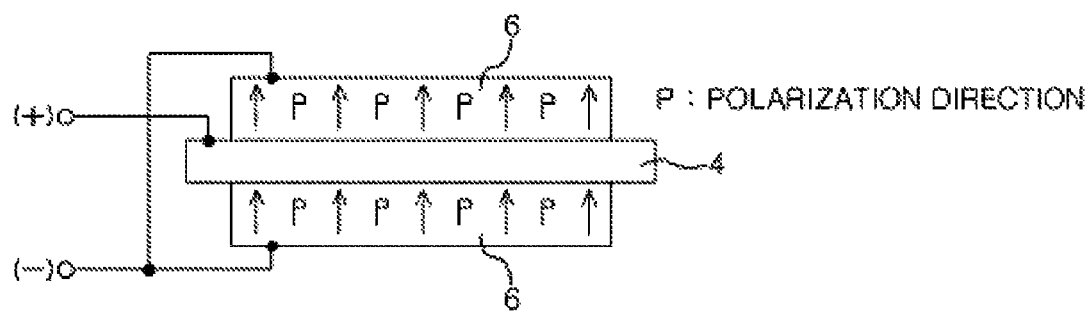
FIG. 1 is a conceptual view illustrating an operational principle of bimorph parallel type piezoelectric element layers of a piezoelectric vibration device for a mobile terminal according to an embodiment of the present invention.

Hereinafter, preferred embodiments of the present invention will be described in detail with reference to the annexed drawings.

A piezoelectric vibration device for a mobile terminal according to an embodiment of the present invention is a vibration generator using a piezoelectric effect.

A piezoelectric effect is defined as: a piezoelectric material produces a voltage when subjected to mechanical strain. Conversely, a reverse piezoelectric effect is defined as: a piezoelectric material becomes mechanically strained when a high voltage is applied to the same. The piezoelectric effect can be used in, for example, a piezoelectric element for ignition (a lighter and a gas stove), a pressure sensor, an accelerometer sensor and the like. The reverse piezoelectric effect can be used in, for example, an actuator, a piezo motor and the like.

Specifically, the vibration device of the present invention is embodied with a vibration generator using the reverse piezoelectric effect, wherein a piezoelectric element layer is made of a piezoelectric material and vibration is generated using a property that the piezoelectric material is mechanically strained by a voltage applied thereto. The representative piezoelectric material includes ferroelectric Lead Zirconate Titanate (PZT, $Pb(Ti,Zr)O_3$), Barium Titanate ($BaTiO_3$) and the like, and a piezoelectric ceramic is formed using the above.

Vibration devices using the piezoelectric effect may be classified into a unimorph type, a bimorph type and a multimorph type. The bimorph type may be classified into a serial type and a parallel type according to a polarization direction.

The unimorph type is primarily used in acoustic wave generating apparatuses such as a buzzer, an alarm, a speaker and the like. The multimorph type is used to obtain a relatively large force while a bending displacement of a piezoelectric element is small. Such a unimorph type, bimorph type or multimorph type piezoelectric element needs a voltage higher than a voltage used in a portable electronic apparatus in order to produce vibration. Moreover, because the multimorph type piezoelectric element includes four or more layers, a thickness thereof becomes large and accordingly, it is inappropriate to install the same to a mobile terminal such as a smartphone which has a limited installation space therein.

The bimorph type piezoelectric element has an advantage in generating vibration because the same can be operated by a relatively low driving voltage, a resonant frequency band is relatively low and a bending displacement generated by a voltage applied thereto is relatively large.

In installing a vibration device using a reverse piezoelectric effect to a mobile terminal, such as a smartphone, many preconditions and restrictions in accordance with a slim design trend of mobile terminals should be solved.

Preconditions and restrictions in realizing a vibration device for a mobile terminal are as follows: a battery voltage of a portable electronic apparatus and a voltage required to drive a piezoelectric element should be considered, and limitation in size and thickness of a piezoelectric element to be installed in a limited space of a portable electronic apparatus and durability and shock resistance of a piezoelectric element should also be considered. Further, a vibration device should have insulation property to prevent leakage of a current flowing through a piezoelectric element. In addition, a vibration device should have vibration amplifying process and constitution to amplify vibration of a piezoelectric element and transmit the amplified vibration to a casing of a mobile terminal.

However, the present inventor has solved the above preconditions and restrictions in realizing a vibration device using a reverse piezoelectric effect by choosing a bimorph type piezoelectric element based upon various experiments and studies.

FIG. 1 is a view schematically illustrating an operational principle of a piezoelectric vibration device including bimorph parallel type piezoelectric element layers according to an embodiment of the present invention.

A piezoelectric vibrator 2 includes piezoelectric element layers 6 which have piezoelectric property and are arranged parallel to each other and a middle electrode plate 4 interposed between the piezoelectric element layers 6. One of positive and negative poles is connected to the piezoelectric element layers 6, and the other pole is connected to the middle electrode plate 4.

If a driving voltage for driving the piezoelectric vibrator 2 is applied to the piezoelectric element layers 6 and the middle electrode plate 4, positive charges and negative charges in the piezoelectric elements layers 6 are aligned in a polarization direction from an arbitrary arrangement state. If positive and negative voltages are alternately applied to the middle electrode plate 4 and the piezoelectric element layers 6 connected in parallel as illustrated in FIG. 1, an expansion and contraction phenomenon occurs.

Figure 2A:
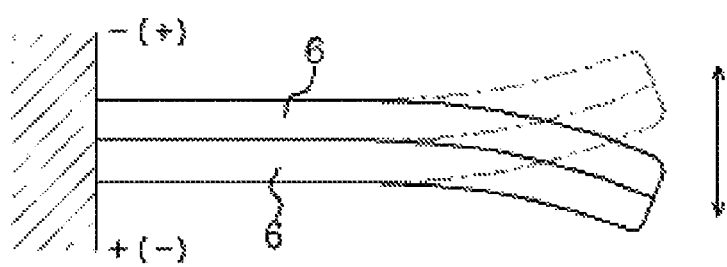
FIGS. 2a and 2b are views illustrating a vibration pattern of the piezoelectric vibration device for a mobile terminal depicted in FIG. 1.
Figure 2B:
Figure 2B:
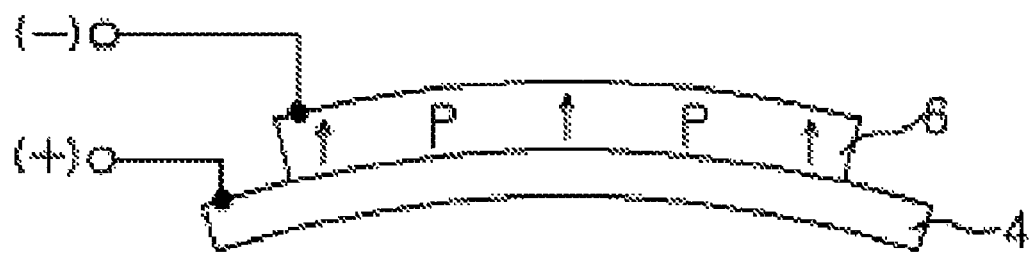
Figure 3:
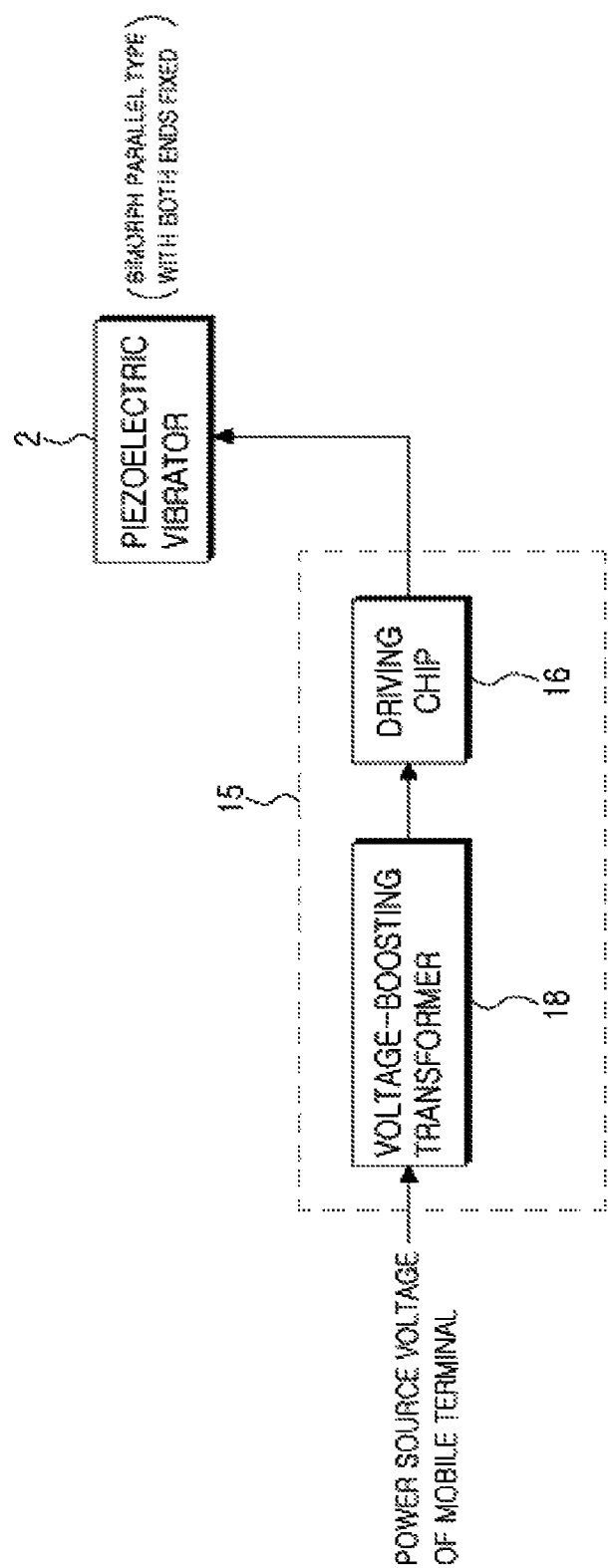
FIG. 3 is a block diagram of the piezoelectric vibration device for a mobile terminal according to the embodiment of the present invention.

One end or both ends of the piezoelectric vibrator 2 in FIG. 1 may be fixed. As illustrated in FIG. 2a, in the case in which one end of the piezoelectric vibrator 2 is fixed, the other end becomes a free end which can be bent up and down. As illustrated in FIG. 2b, in the case in which both ends are fixed, a center portion of the piezoelectric vibrator 2 can be bent up and down (expansion and contraction). Bending displacement caused by such repeated up and down bending of the piezoelectric vibrator 2 generates vibration.

Different from a conventional linear vibration motor in which vibration is generated by resonance with a motor structure using a fixed frequency (e.g., about 175 Hz), the vibration device using piezoelectric features according to the present invention can generate vibration by frequency variation within a wide frequency band range from about 0 to about 300 Hz.

Further, the piezoelectric vibrator 2 has a response speed of about 0.002 second or less and can be precisely controlled in vibration magnitude and speed by adjusting a frequency within a range from about 0 to about 300 Hz, which generates a delicate and simultaneous vibration effect corresponding to sound and image of a mobile terminal.

A driving voltage for driving the piezoelectric vibrator 2 is preferably in the range from about 20 to about 300V. A driving unit 15 includes a voltage-boosting transformer 18 to raise a power source voltage of a mobile terminal to a driving voltage and a driving chip 16 to drive the piezoelectric vibrator 2 by the raised driving voltage. The raised driving voltage is applied to the piezoelectric vibrator 2 through the driving unit 15.

If a voltage raised by the voltage-boosting transformer 18 and applied to the piezoelectric vibrator 2 is less than about 20V, the vibration device may not be operated. If a voltage is greater than about 300V, an electric load may be too high to apply the voltage to an electronic apparatus such as a mobile terminal.

In the embodiments of the present invention, vibration is generated by periodically supplying and cutting off a voltage to the piezoelectric vibrator 2 or alternately applying positive and negative voltages to the piezoelectric vibrator 2. Preferably, the middle electrode plate 4 of the piezoelectric vibrator 2 may be made of a material having excellent electrical conductivity and flexibility.

Because the piezoelectric vibrator 2 of the present invention is attached to an electronic apparatus such as a smartphone, it is desirable that the piezoelectric vibrator 2 has a small thickness and the piezoelectric element layers 6 are made of a PZT piezoelectric ceramic, however, the material of the piezoelectric element layers 6 is not limited thereto.

If the piezoelectric element layers 6 are only made of a polycrystalline ceramic material (hard PZT), the piezoelectric element layers 6 may be easily cracked by vibration generated by bending, shock by falling of a product or the like. Therefore, the piezoelectric element layers 6 are made of one selected from a composite material group including PZT-Polyvinylidene Fluoride (PZT-PVDF), PZT-Silicone Rubber, PZT-Epoxy, PZT-Foaming Polymer and the like or one selected from a polymeric material group including PVDF, P(VDF-TrFE), P(VDF-TeFE), TGS and the like. Accordingly, the piezoelectric element layers 6 can be prevented from being cracked by enhancing durability while reducing a thickness.

More particularly, the piezoelectric vibrator 2 has preferably a thickness of about 0.3 to about 1 mm so as to satisfy installation conditions in accordance with a lightweight and slim design trend of electronic apparatuses.

The piezoelectric vibration device for a mobile terminal according to a preferred embodiment of the present invention will now be described in detail with reference to FIGS. 4 through 7.

Figure 4:
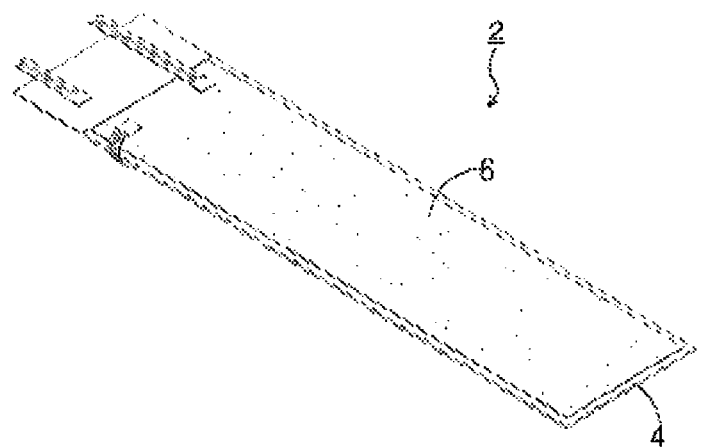
FIG. 4 is a perspective view illustrating constitution of installing a piezoelectric vibrator to a case of a mobile terminal.

Referring to FIG. 4, the piezoelectric vibrator 2 of the present invention includes the middle electrode plate 4 having high electrical conductivity and the piezoelectric element layers 6 made of a ceramic material and attached to both sides of the middle electrode plate 4. After the piezoelectric vibrator 2 is formed by integrally coupling the middle electrode plate 4 and the piezoelectric element layers 6, electric power is periodically supplied and cut off to the middle electrode plate 4 and the piezoelectric element layers 6.

In this embodiment, a voltage is applied to the middle electrode plate 4 and the piezoelectric element layers 6 in a flexible printed circuit board (FPCB) form in order to minimize a whole thickness of the piezoelectric vibrator 2.

Figure 5A:
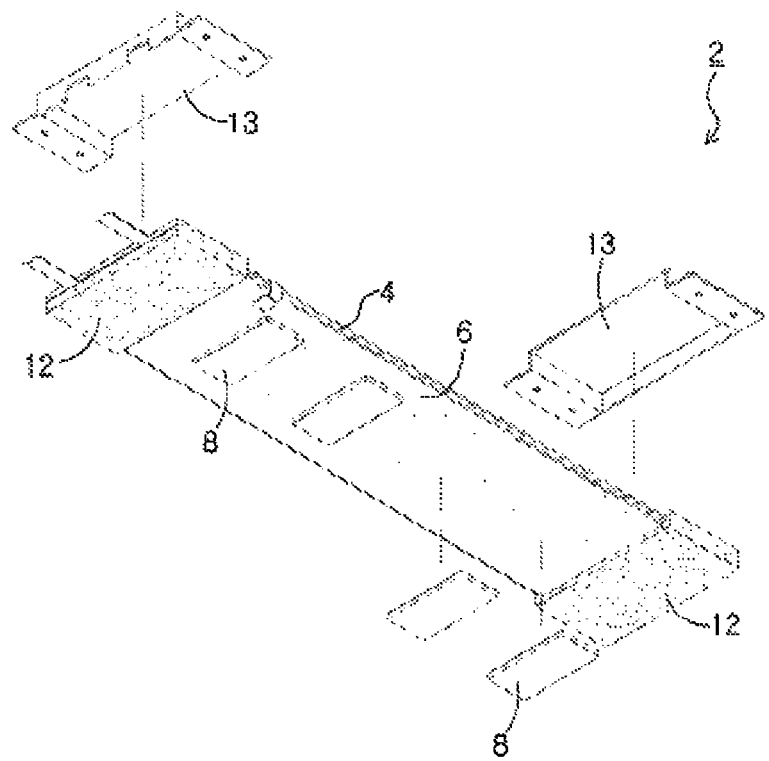
FIGS. 5a and 5b are exploded perspective views of the piezoelectric vibrator depicted in FIG. 4.

Referring to FIG. 5a, the piezoelectric vibrator 2 further includes a plurality of weights 8 which are attached to one side of one of the piezoelectric element layers 6 in order to amplify vibration generated by the voltage applied to the piezoelectric vibrator 2. Although the piezoelectric vibrator 2 generates vibration by an up/down bending displacement thereof, the vibration magnitude transmitted to a mobile terminal is low. Such a problem can be solved by the weights 8 which are uniformly formed and attached to the piezoelectric element layer 6 so as to amplify vibration.

Preferably, the weights 8 attached to the piezoelectric vibrator 2 totally weigh from about 0.5 to about 5 g. If the weights 8 weigh less than about 0.5 g, a vibration amplifying effect may not be achieved sufficiently. Meanwhile, if the weights 8 weigh more than about 5 g, a vibration amplifying effect may be achieved, however, the piezoelectric vibrator 2 installed in a mobile terminal becomes heavy and a response speed thereof becomes low. From such a point of view, the lower limit value (i.e., 0.5 g) and the upper limit value (i.e., 5 g) are set as critical values.

The weights 8 may be made of a tungsten material which has a relatively high specific gravity and may be formed in a foil shape. The weights 8 may be attached to the piezoelectric element layer 6 using an adhesive agent. The adhesive agent for adhesion of the weights 8 may be an epoxy or acrylic adhesive agent.

The weights 8 may be attached to one side of the piezoelectric vibrator 2 as shown in FIG. 5a, or may be attached to both sides of the piezoelectric vibrator 2 as needed. In the case in which the weights 8 are only attached to one side of the piezoelectric vibrator 2, a protective tape 20 is attached to the other side, to which the weights 8 are not attached, of the piezoelectric vibrator 2. The protective tape 20 serves to prevent the piezoelectric ceramic from being cracked by vibration of the piezoelectric vibrator 2, falling of a mobile terminal or other shocks. In addition, the protective tape 20 provides an insulation effect.

In the case wherein the piezoelectric vibrator 2 is directly attached to a rear surface of an LCD of a mobile terminal, the weights 20 may not be attached to the piezoelectric vibrator 2. In such a case, the protective tape 20 is attached to both sides of the piezoelectric vibrator 2 in order to prevent cracking of the piezoelectric ceramic and enhance an insulation effect.

The shape and number of the weights 8 are not limited to the constitution illustrated in the drawings, and it should be understood that the weights 8 can be installed in various shapes and numbers.

If vibration of the piezoelectric vibrator 2 is directly transmitted to a casing 14 of a mobile terminal, an acoustic wave is naturally generated due to frequency rise. In order to prevent this phenomenon, soundproof sheets 10 are interposed between the piezoelectric element layers 6 and insulation members 12 at both end portions of the piezoelectric vibrator 2, thereby restricting a noise which may occur with vibration of the piezoelectric element layers 6.

Describing in more detail, if a frequency is raised for vibration of the piezoelectric vibrator 2, an acoustic wave is generated and a noise is transmitted outside. A magnitude of the acoustic wave is increased as vibration magnitude and speed are increased. By attaching the soundproof sheets 10 to both end portions of the piezoelectric vibrator 2, an acoustic wave generated due to frequency rise is absorbed and noise transmission is prevented.

The soundproof sheets 10 are preferably made of a soft rubber material such as silicon. The soundproof sheets 10 may also be made of a material having good elasticity, such as fabric tape, elastic rubber, resin tape, elastic silicone tube or the like. In addition, the surface of the piezoelectric element layers 6 may be coated with soft epoxy, soft urethane or the like, thereby restricting noise occurrence due to vibration and providing an insulation effect.

In the case in which sound as well as vibration generated from the piezoelectric vibrator 2 is intended to be utilized, the soundproof sheets 10 may be removed from both end portions of the piezoelectric vibrator 2 or may be replaced with a hard material, thereby producing both vibration and sound from a mobile terminal.

As described above, a power source voltage of a mobile terminal is raised by the voltage-boosting transformer 18 and then applied to the piezoelectric vibrator 2 through the driving chip 16 so as to generate vibration. Because a current according to a DC voltage of about 20 to about 300V flows on the surface of the piezoelectric vibrator 2 during the vibration operation, a structure for preventing the current from leaking to the casing 14 is needed.

Accordingly, insulation members 12 are attached to both end portions of the piezoelectric vibrator 2, to which the soundproof sheets 10 are attached, so as to prevent electricity of the piezoelectric vibrator 2 from leaking to the casing 14.

In this embodiment, by virtue of the insulation members attached to both end portions of the piezoelectric vibrator 2 and the protective tape 20 attached to the surface of the piezoelectric element layer 6, a current according to the raised voltage is prevented from leaking to the casing 14. The insulation members 12 are preferably configured with a thermal shrinkable tape having insulation property, or may also be configured with an insulation tape, a silicone tube or a separate insulation structure.

After the insulation members 12 are attached to both end portions of the piezoelectric vibrator 2, brackets 13 for fixing the piezoelectric vibrator 2 are coupled to both end portions of the piezoelectric vibrator 2. The brackets 13 serve to fix the piezoelectric vibrator 2 to an inner surface 14a of the casing 14 and are preferably formed to have a size corresponding to the insulation members 12. The brackets 13 are preferably made of a material having a high intensity with a small thickness. In this embodiment, the brackets 13 are made of stainless steel such as SUS410, or may be made of steel having a high intensity or plastic material.

The brackets 13 may be attached to the inner surface 14a of the casing 14 to fix the piezoelectric vibrator 2 by welding or adhesion according to a material of a mobile terminal. In order to minimize a thickness of the vibration device, the piezoelectric vibrator 2, to which the insulation members 12 are attached, may be directly attached to the casing 14 without the brackets 13. In this case, an epoxy or acrylic adhesive agent may be used to directly attach the piezoelectric vibrator 2 to the casing 14.

Figure 5B:
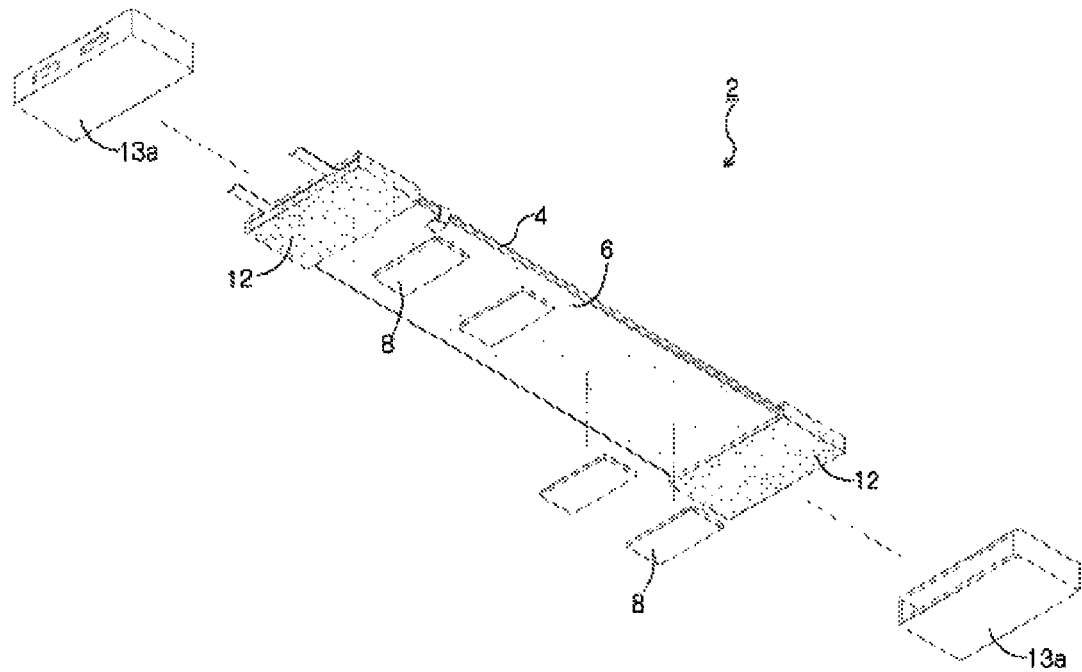

As illustrated in FIG. 5b, instead of the brackets 13 coupled to the upper surface of the piezoelectric vibrator 2 to fix the same, another type of brackets 13a, into which both end portions of the piezoelectric vibrator 2 are inserted, may be used. In the case of using the brackets 13a, a bottom surface of the brackets 13a may be attached to the inner surface 14a of the casing 14 using an adhesive agent.

Figure 6:
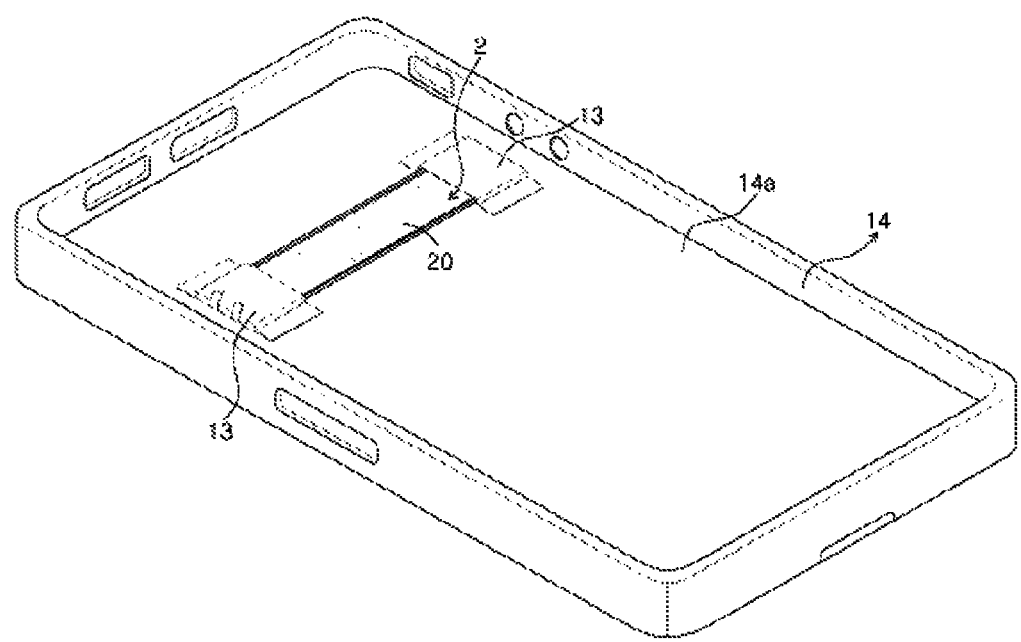
FIG. 6 is a perspective view illustrating a used state of the piezoelectric vibration device for a mobile terminal according to the embodiment of the present invention.
Figure 7:
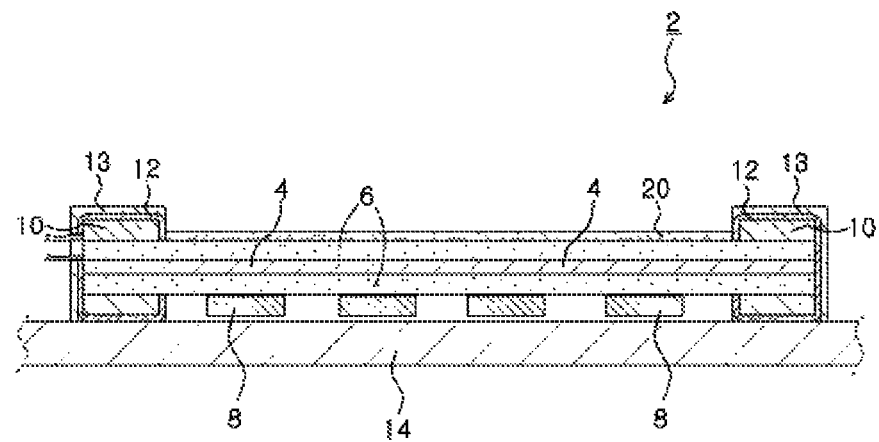
FIG. 7 is a sectional view of the piezoelectric vibration device for a mobile terminal according to the embodiment of the present invention.

FIG. 6 is a view illustrating a used state of the piezoelectric vibration device of the present invention. Referring to the drawing, both end portions of the piezoelectric vibrator 2 are fixed to the inner surface 14a of the casing 14 of a mobile terminal by the brackets 13, to thereby prevent separation of the piezoelectric vibrator 2 due to vibration.

Figure 8:
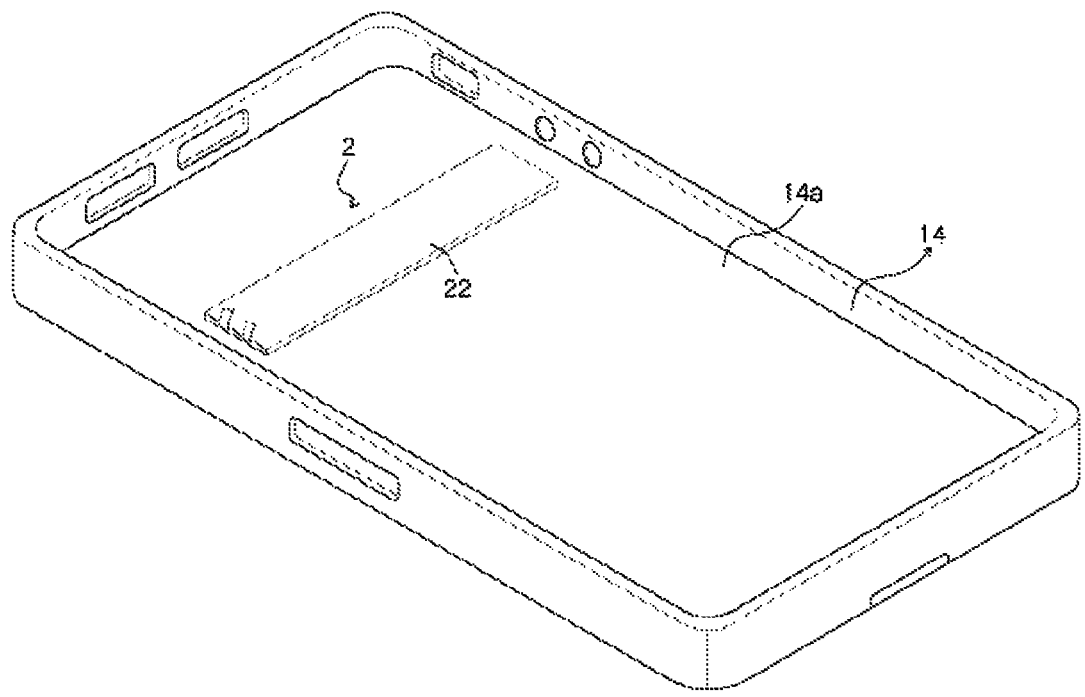
FIG. 8 is a perspective view illustrating a used state of a piezoelectric vibration device for a mobile terminal according to another embodiment of the present invention.
Figure 9:
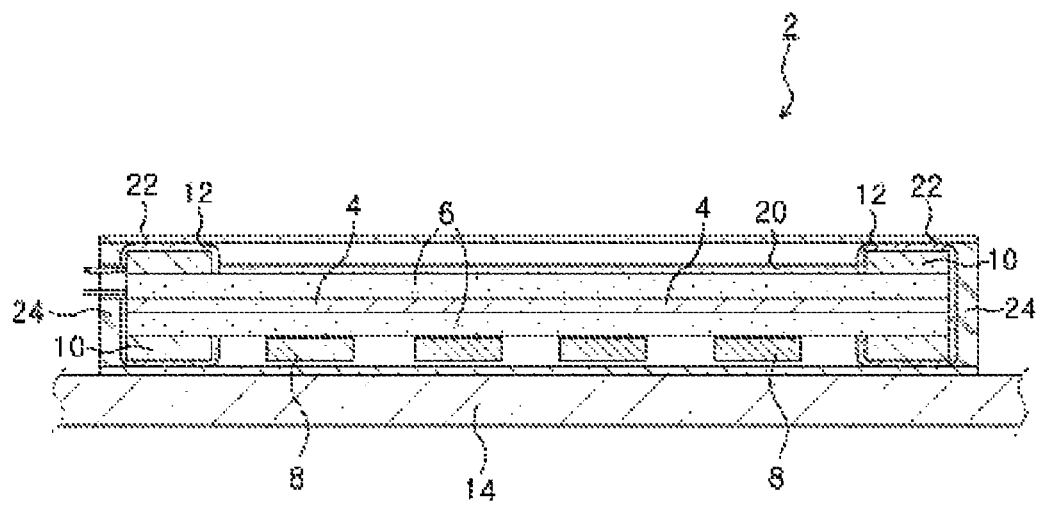
FIGS. 9 and 10 are sectional views of the piezoelectric vibration device for a mobile terminal according to another embodiment of the present invention.

The vibration device of the present invention, as shown in FIGS. 8 and 9, includes a vibration module case 22. After the piezoelectric vibrator 2 is securely fitted in the vibration module case 22, the vibration module case 22 is attached to the inner surface 14a of the casing 14.

Describing in more detail, the piezoelectric vibrator 2 is inserted into an inner space of the vibration module case 22 through one side portion of the vibration module case 22. Preferably, the vibration module case 22 has the inner space which is large enough to accommodate the piezoelectric vibrator 2, and is longer than the piezoelectric vibrator 2. The vibration module case 22 is preferably made of aluminum, stainless steel, steel, synthetic resin or the like.

After the piezoelectric vibrator 2 is inserted into the vibration module case 22, both end portions of the vibration module case 22 are closed by a sealing adhesive agent 24. The sealing adhesive agent 24 may be silicon, a UV adhesive agent, epoxy or the like. By closing both end portions of the vibration module case 22, the sealing adhesive agent 24 has a soundproof function capable of preventing an acoustic wave generated by vibration of the piezoelectric vibrator 2 from leaking outside. In addition, the vibration module case 22 has a function of protecting the piezoelectric vibrator 2 inserted thereinto.

Figure 10:
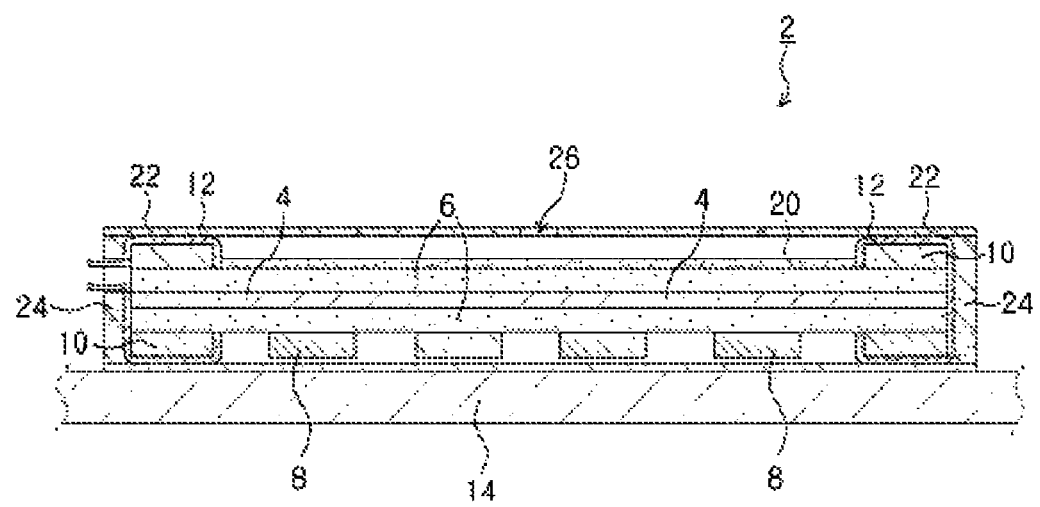

In the case in which sound as well as vibration generated from the piezoelectric vibrator 2 inserted into the vibration module case 22 is intended to be utilized, as shown in FIG. 10, a plurality of through-holes 26 are formed at an upper surface of the vibration module case 22, through which an acoustic wave generated with vibration of the piezoelectric vibrator 2 is transmitted outside, so that a mobile terminal can produce both vibration and sound.

After the piezoelectric vibrator 2 is inserted into the vibration module case 22, a lower surface of the vibration module case 22 is attached to the inner surface 14a of the casing 14. An adhesive agent for fixing the vibration module case 22 is preferably a double-sided tape, or may be an epoxy or acrylic adhesive agent or the like.

Since the whole lower surface of the vibration module case 22, into which the piezoelectric vibrator 2 is inserted, is fixed to the casing 14, an adhesion area is increased and thus the vibration module case 22 can be stably fixed. Accordingly, an effect of transmitting vibration generated from the piezoelectric vibrator 2 to a mobile terminal through the casing 14 is enhanced. Further, since the vibration module case 22 and the piezoelectric vibrator 2 are integrally provided by insertion, a manufacturing time taken to fix the vibration device to a mobile terminal can be shortened.

Figure 11A:
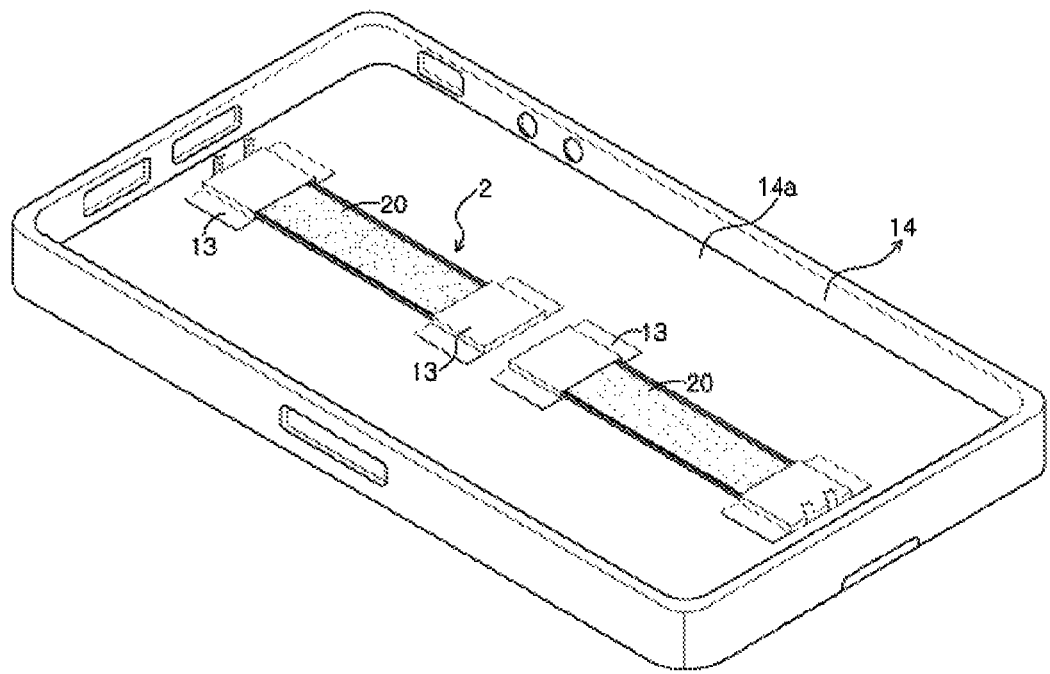
FIGS. 11a through 11c are perspective views illustrating constitution of installing a plurality of piezoelectric vibrators to a case of a mobile terminal.
Figure 11B:
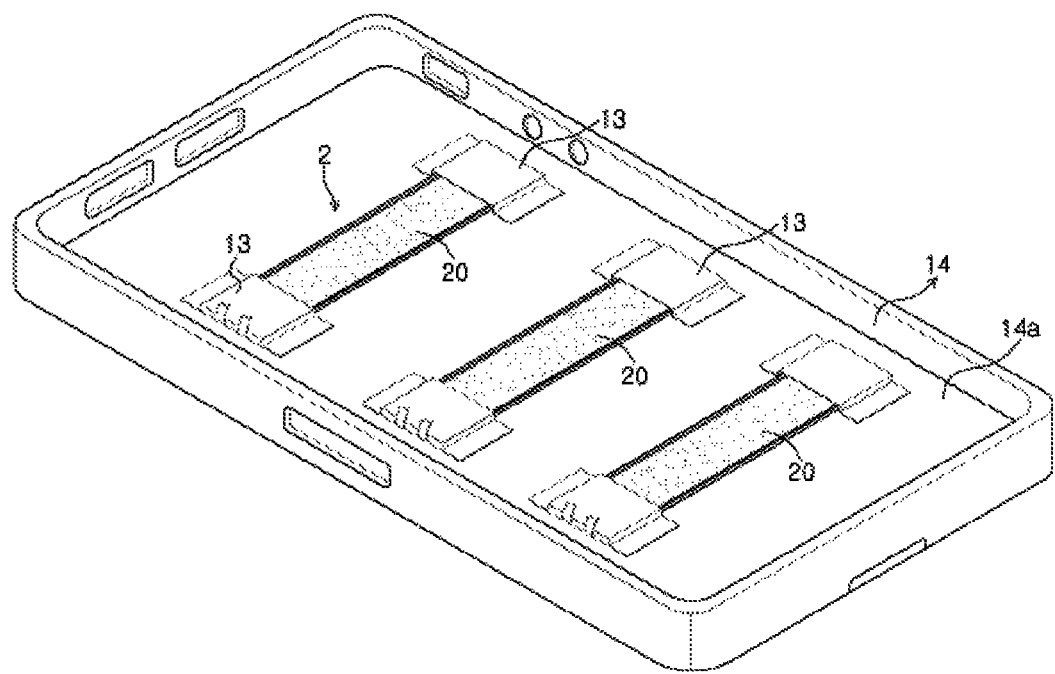
Figure 11C:
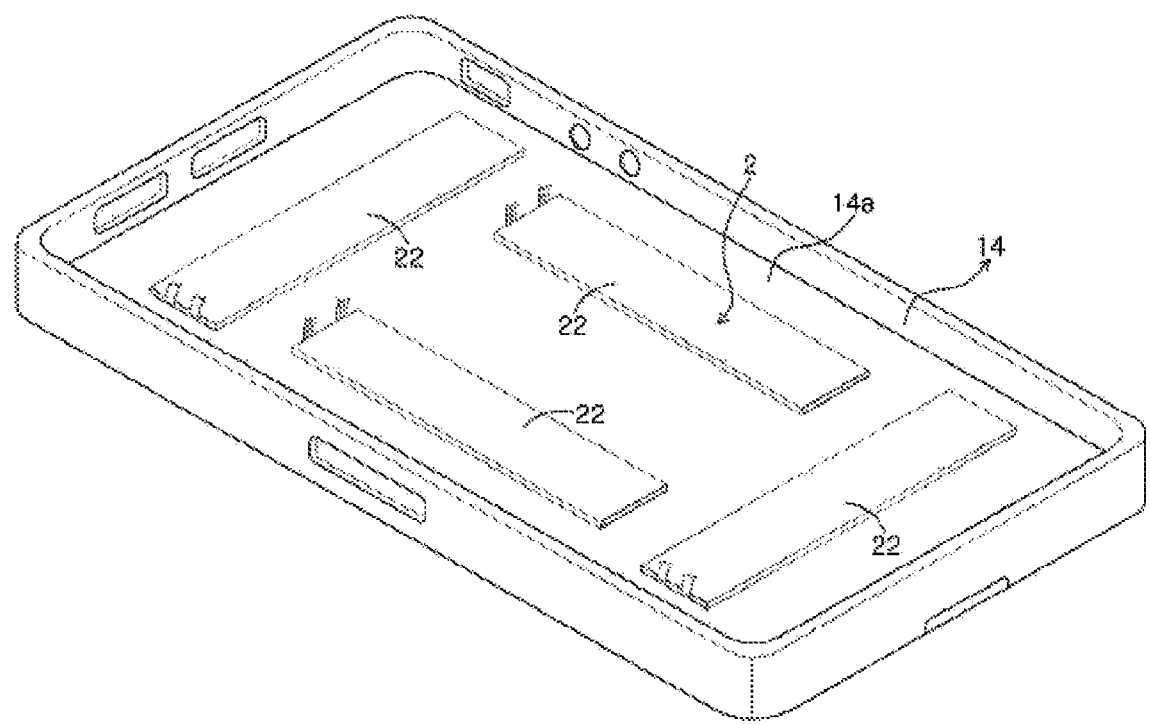

According to features of a mobile terminal, as illustrated in FIGS. 11a through 11c, the piezoelectric vibrator 2 of the present invention may be provided in plural numbers which are arranged in various patterns (e.g., arrangement in series, parallel or circular shape) in the limited space of a mobile terminal, thereby producing various vibration effects.

The structure, in which the plural piezoelectric vibrators 2 are arranged in series or parallel as shown in FIGS. 11a and 11b, has an effect of generating a feel in which vibration flows in one direction (e.g., from left to right or vice versa, from up to down or vice versa). The structure, in which the plural piezoelectric vibrators 2 are arranged in a circular shape as shown in FIG. 11c, has an effect of generating a feel in which vibration flows in a circle.

The plurality of piezoelectric vibrators 2 mounted in a mobile terminal is independently controlled. By controlling vibration magnitude, speed and position of each of the piezoelectric vibrators 2, vibration signals can be easily discriminated, and multi position vibration as well as simple vibration can be achieved.

The present invention can be used to all kinds of haptic devices, such as OA devices, medical devices, mobile communication devices and the like.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A piezoelectric vibration device for a mobile terminal, comprising:
    a bimorph piezoelectric vibrator including a pair of piezoelectric element layers connected to one of positive and negative poles and a middle electrode plate interposed between the piezoelectric element layers and connected to the other pole, the piezoelectric vibrator being configured to generate vibration due to up/down bending displacement by fixing both end portions of the piezoelectric vibrator to an inner surface of a casing of a mobile terminal;
    a voltage-boosting transformer to raise a power source voltage of a mobile terminal to a driving voltage of about 20 to about 300V;
    a driving chip to receive the raised driving voltage from the voltage-boosting transformer and drive the piezoelectric vibrator by the raised driving voltage;
    weights attached to at least one of both sides of the piezoelectric vibrator in order to amplify vibration of the piezoelectric vibrator; and
    insulation members to insulate both end portions of the piezoelectric vibrator from the inner surface of the casing, thereby preventing electricity applied to the piezoelectric vibrator from leaking to the casing.

2. The piezoelectric vibration device according to claim 1, further comprising:
    soundproof sheets interposed between both end portions of the piezoelectric vibrator and the casing in order to restrict a noise due to vibration of the piezoelectric element layers.

3. The piezoelectric vibration device according to claim 1, wherein the weights are made of a tungsten material having a relatively high specific gravity and totally weigh from about 0.5 to about 5 g.

4. The piezoelectric vibration device according to claim 1, further comprising:
    a protective tape attached to another side, opposite to the side to which the weights are attached, of the piezoelectric vibrator in order to prevent cracking of the piezoelectric element layers.

5. The piezoelectric vibration device according to claim 4, wherein the protective tape is attached to both sides of the piezoelectric vibrator without the weights.

6. The piezoelectric vibration device according to claim 1, wherein the piezoelectric element layers are made of one selected from a material group including PZT-Polyvinylidene Fluoride (PZT-PVDF), PZT-Silicone Rubber, PZT-Epoxy, PZT-Foaming Polymer, PVDF, P(VDF-TrFE), P(VDF-TeFE) and TGS.

7. The piezoelectric vibration device according to claim 1, further comprising:
    brackets to fix both end portions of the piezoelectric vibrator to the inner surface of the casing.

8. The piezoelectric vibration device according to claim 1, wherein the insulation members are configured with one of a thermal shrinkable tape, an insulation tape, a silicone tube and an insulation structure.

9. The piezoelectric vibration device according to claim 1, wherein the piezoelectric element layers are coated with one of soft epoxy and soft urethane on a surface thereof, thereby restricting noise occurrence due to vibration and providing an insulation effect.

10. The piezoelectric vibration device according to claim 1, wherein the insulation members provided at both end portions of the piezoelectric vibrator are directly attached to the casing using one of an epoxy adhesive agent and an acrylic adhesive agent.

11. The piezoelectric vibration device according to claim 1, further comprising:
    a vibration module case into which the piezoelectric vibrator is inserted,
    wherein both end portions of the vibration module case are closed by a sealing adhesive agent, thereby preventing sound generated due to vibration from leaking outside.

12. The piezoelectric vibration device according to claim 11, wherein the vibration module case is formed with a plurality of through-holes through which an acoustic wave generated with vibration of the piezoelectric vibrator inserted into the vibration module case is transmitted outside.

* * * * *